United States Patent [19]
Coles

[11] 4,384,258
[45] May 17, 1983

[54] ELECTRONIC AMPLIFIERS

[75] Inventor: Julian M. Coles, Cambridge, England

[73] Assignee: Crosfield Electronics Limited, London, England

[21] Appl. No.: 203,947

[22] Filed: Nov. 4, 1980

[30] Foreign Application Priority Data

Nov. 5, 1979 [GB] United Kingdom ................. 7938211

[51] Int. Cl.³ ............................................. H03F 3/38
[52] U.S. Cl. .................................... 330/10; 330/146; 346/108
[58] Field of Search ............... 330/10, 146; 346/76 L, 346/108

[56] References Cited

U.S. PATENT DOCUMENTS 3,189,839  6/1965  Eckhardt .............................. 330/10
3,745,586  7/1973  Brandy .............................. 346/76 L
3,829,788  8/1974  Ford .................................... 330/10

Primary Examiner—James B. Mullins
Attorney, Agent, or Firm—Kemon & Estabrook

[57] ABSTRACT

In an electronic amplifier having a floating output stage (42), a demand signal modulates a high frequency carrier (e.g. 20MHz) and the modulated carrier is applied to the floating output stage through a capacitance (10) of very low value (e.g. 1pf) and is then demodulated. The amplifier is preferably a bridge amplifier and each arm of the bridge may comprise a number of floating output stages, each supplied with the modulated carrier through a low-value capacitor (10). As described, the amplifier drives a crystal (40) for modulating electromagnetic radiation from a laser.

14 Claims, 6 Drawing Figures

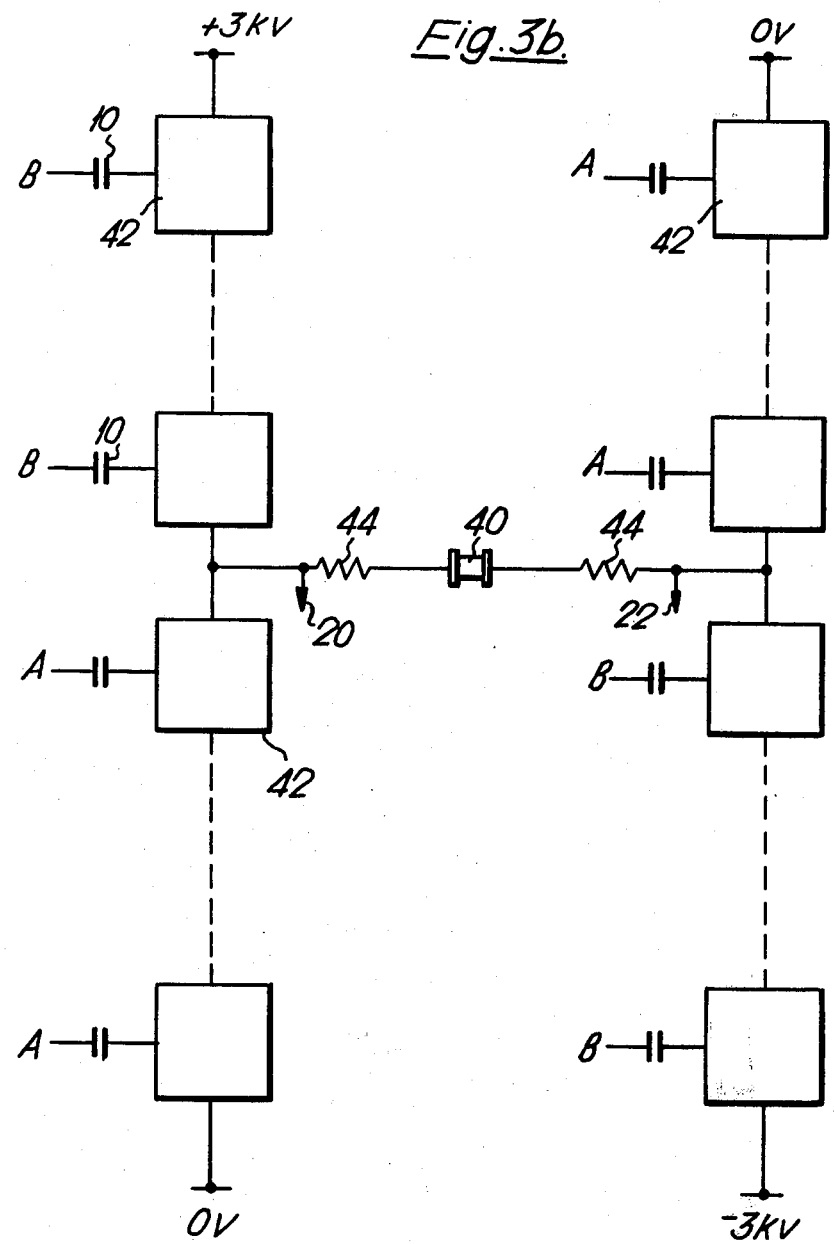

ELECTRONIC AMPLIFIERS

This invention relates to an amplifier for providing a driving voltage having a very high rate of change. As an example, the invention may be applied to a circuit for driving a light-modulation crystal in electro-optical image reproduction equipment.

A difficulty in designing an amplifier to provide a reasonable output current at voltages of about 3 kV is that single transistors with these ratings are unobtainable and techniques such as series connection of a number of transistors are required. The circuits coupling to these output transistors must possess up to 3 kV of d.c. isolation, must not load the amplifier output significantly and must not be susceptible to signals induced by the output voltage slewings. Conventional coupling techniques do not meet these criteria. In addition, the configuration of each output element is critical since the high output voltage slew rates can cause quite large currents to flow through even small capacitive loads.

In the application for which an amplifier incorporating the present invention was designed, the requirement was to drive a capacitive load, effectively about 30 pf, from 0 to 6 kV in two microseconds at a repetition frequency of 100 kHz. A bridge arrangement was used with a total of 20 output devices in a double pushpull configuration.

Each output device can have up to 3 kV dc between its input and ground and any capacitive coupling due to the input circuits would appear as extra load on the output. In some applications, it would have been possible to generate the required current by way of an interface with 3 kV dc isolation using transformer coupling. For driving the light-modulator crystal in the application referred to above, it was required that the amplifier would also work at dc.

Opto-isolator coupling was also considered but was found to be unsuitable because to get a reasonable transfer efficiency and linearity a photo-transistor had to be used as the receiver and the stray coupling capacity into the base of the transistor caused problems when slewing at 1500 volts/$\mu$S.

An electronic amplifier according to the present invention, for driving a load in response to a demand signal, comprises: means for generating a high frequency carrier, a modulator responsive to the demand signal to modulate the high frequency carrier, output means including a floating output stage having a demodulator for demodulating the said carrier, and a capacitance of very low value through which the modulated carrier is applied to the floating output stage, the output means applying the resulting signal to the load. Preferably, the capacitance has a value of 1 pf.

The output means of the amplifier preferably includes a plurality of output stages connected in series, each receiving the modulated carrier through a capacitance of very low value and together providing the resulting signal for the load. One side of the load may be connected to the mid-point of the series of output stages, the output stages on one side of the mid-point being supplied through their capacitances with signals which are in phase opposition with the signals supplied to the output stages on the other side of the mid-point through their capacitances.

In the preferred form of amplifier embodying the invention, feedback is applied from the demodulated output signal to the amplifier input where the demand signal is received. In this preferred form, the high voltage is generated by 20 output circuits in a bridge arrangement or double push-pull configuration. In this arrangement, when the voltage is increasing on one side of the crystal which constitutes the load, it is decreasing on the other side. Differential feedback is taken from both sides of the crystal to the amplifier input.

In order that the invention may be better understood, the preferred form of amplifier embodying the invention will now be described with reference to the accompanying drawings, in which:

FIG. 3b illustrates the manner in which the driving signals are applied to the output stages;

Figure 1:
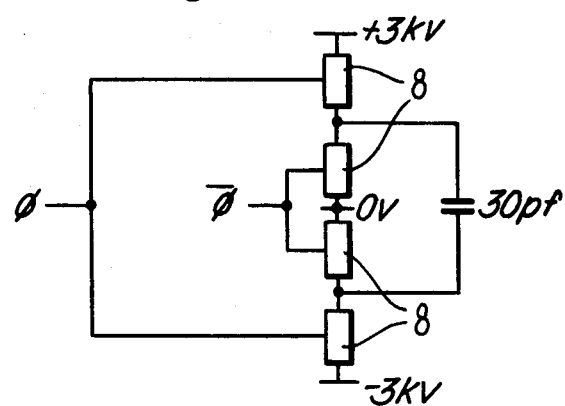
FIG. 1 illustrates the configuration of the preferred amplifier.

In FIG. 1 of the accompanying drawings, two anti-phase error voltages $\phi$ and $\bar{\phi}$ are shown driving outer and inner pairs, respectively, of modules 8 which are connected in series between a positive 3 kv voltage line and a negative 3 kv voltage line. The capacitive load is connected from the junction of the first and second modules to the junction of the third and fourth modules. It will be appreciated that this circuit can be redrawn as a bridge arrangement. Each module contains five series-connected transistors.

Figure 2:
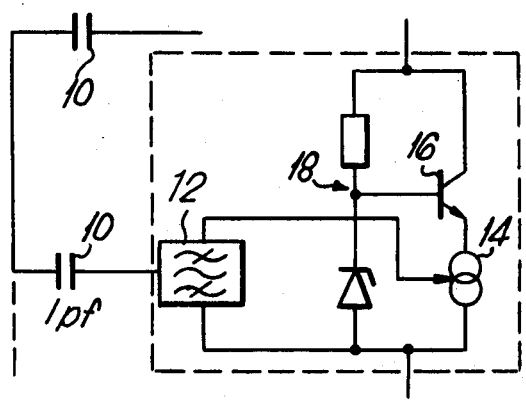
FIG. 2 shows in simplified form an output stage of the preferred amplifier.

FIG. 2 shows the basic configuration for each of the 20 output stages, together with the input coupling capacitance. An amplitude-modulated rf signal is applied through a capacitor 10 of 1 pf to a tuned filter 12 which rejects the induced signal due to output slewing. The resulting signal controls a current source 14 in series with a transistor 16, the current source and transistor being in parallel with a biasing circuit 18. The 1 pf capacitor 10 imposes very little additional load on the amplifier and yet represents a fairly low impedance to the modulated rf signal, which in this case has a carrier frequency of 20 MHz.

FIG. 3 shows the manner in which the anti-phase error signals are derived, together with the output stages and load circuit, here redrawn in bridge configuration.

Figure 3A:
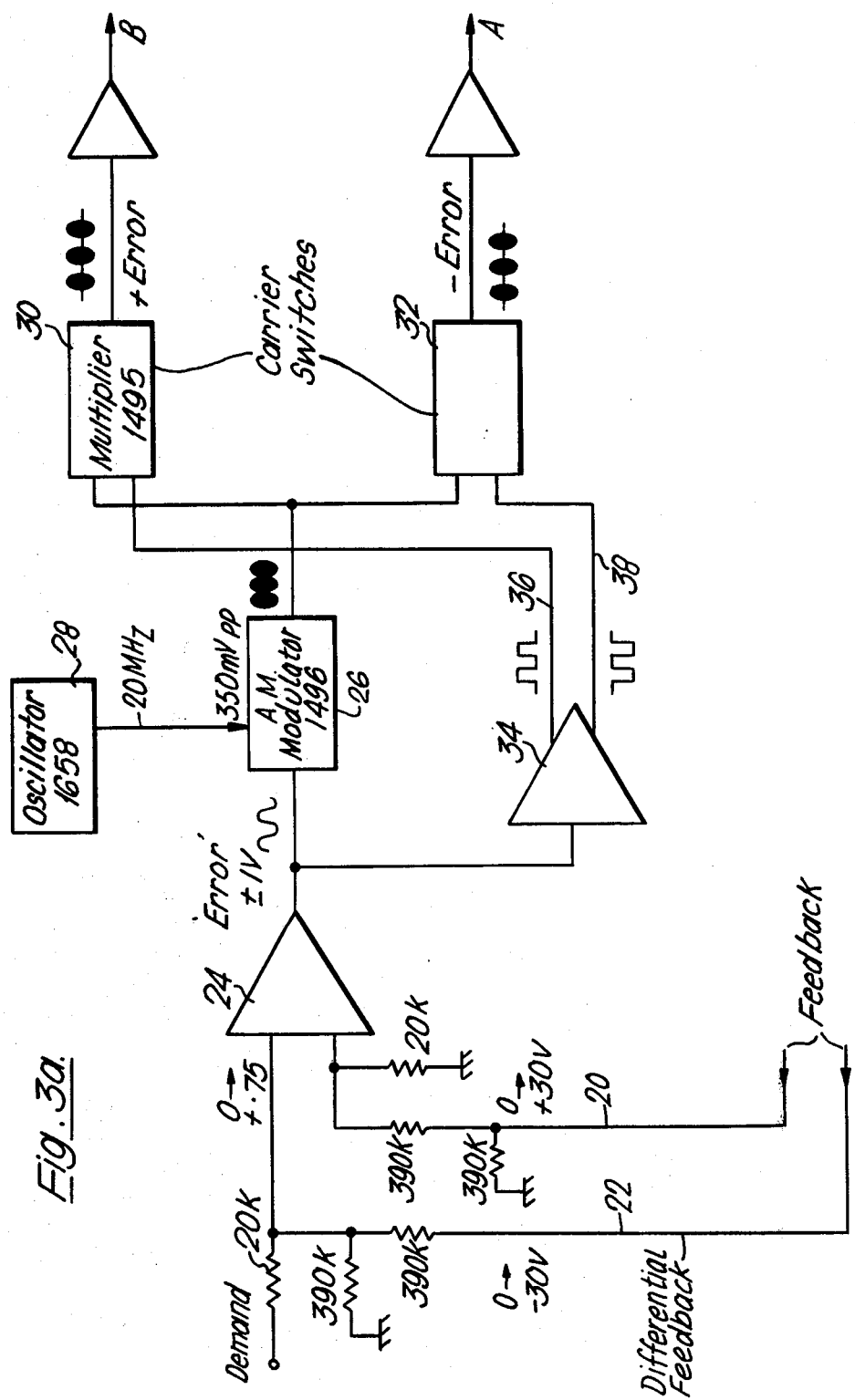
FIG. 3a shows the manner in which the driving signals for the output stages are derived.

In FIG. 3a, a demand signal having an amplitude of 3 volts is applied to one terminal of an amplifier 24. Two feedback connections 20 and 22 from opposite sides of the load are also applied to the amplifier 24. The resulting error signal, shown as an alternating signal of amplitude plus or minus 1 volt, drives an amplitude modulator 26 which also receives the 20 MHz from an oscillator 28. The output is a modulated carrier which is applied to each of two multiplier circuits 30 and 32 acting as carrier switches.

The error signal is also applied to a comparator 34 which ascertains the polarity of the error and generates corresponding phase-opposed signals on its two output lines 36 and 38. These output lines provide second inputs to the multipliers or carrier switches 30 and 32 respectively, which consequently provide half-cycles of amplitude modulated carrier, one multiplier output representing a positive error and the other a negative error and the two outputs being in phase opposition.

These error signals, after amplification, drive the demodulators through the 1 pf capacitors.

The crystal 40 (FIG. 3b) is connected between the mid-points of the two chains of output stages 42 through decoupling resistors 44. When the crystal 40 is to be driven in one sense, an increased current will flow through both the upper stages of the left-hand chain and the lower stages of the right-hand chain. This current, or at least a part of it, flows into the load. The situation is reversed when the crystal is to be driven in the other sense.

Figure 4:
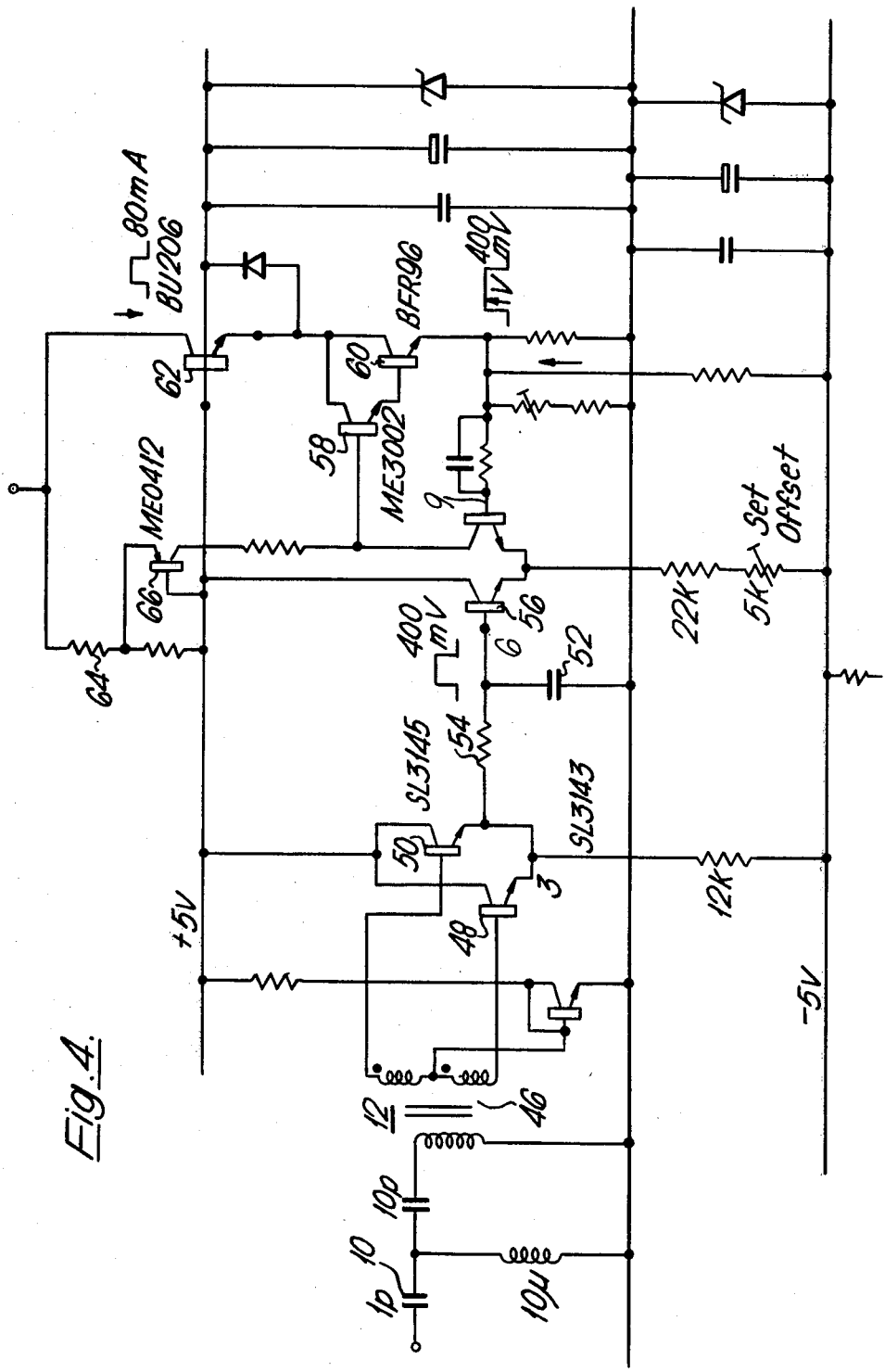
FIG. 4 shows the circuit of an output stage.

FIG. 4 shows a single output stage in greater detail. The modulated carrier error signal, with a frequency of 20 MHz and a peak-to-peak amplitude of 14 volts, passes through the 1 pf capacitor 10 to the tuned filter circuit 12 including the transformer 46 with the tapped output winding, which rejects the induced signal due to the output slewing. Opposite ends of this winding extend to the bases of two parallel transistors 48 and 50 in a five-transistor array circuit (type SL3145), arranged so that pin 3 of the circuit has a full-wave rectified version of the carrier. This rectified signal is smoothed by capacitor 52 and resistor 54 and is applied at pin 6 to the base of a first transistor 56 of an operational amplifier which comprises the differential amplifier including the said transistor 56 and transistors 58 and 60. This amplifier configuration is such that the signal at pin 9 is forced to be equal to that at pin 6 and thus a current proportional to the amplitude of the modulated carrier is driven into the high voltage transistor 62 (BU 206), which corresponds to transistor 16 in FIG. 2. Resistor 64 is a 68 k biasing resistor and transistor 66 provides an antisaturation limit for transistor 62.

Figure 5:
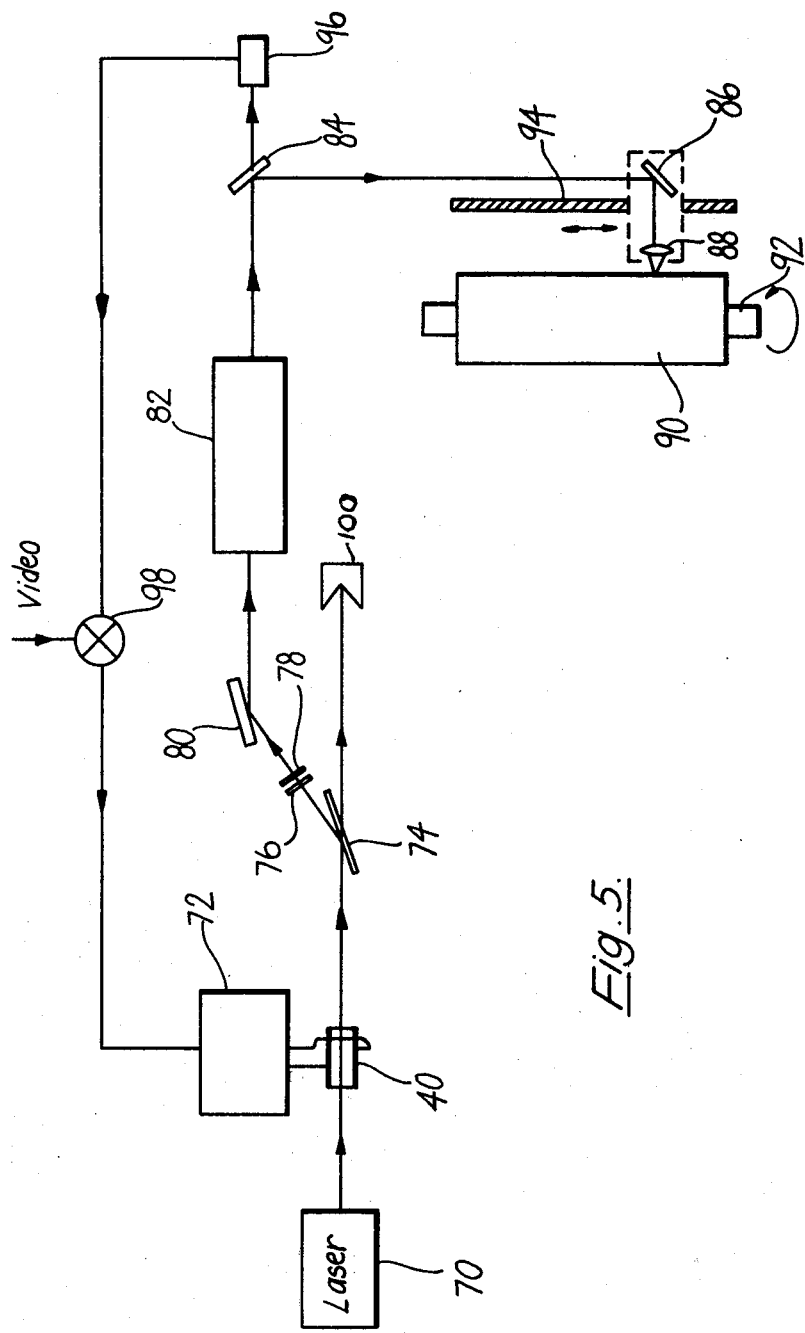
FIG. 5 illustrates apparatus of a kind to which the invention may advantageously be applied.

In FIG. 5, there is shown an image-reproduction apparatus including an electronic amplifier of the kind which has been described, as well as a modulator crystal.

In FIG. 5, the modulator crystal 40 receives plane polarized electromagnetic radiation from a laser oscillator 70. The block 72 represents the high voltage modulator amplifier which has already been described in connection with FIGS. 1 to 4 and which supplies the modulating signal to the crystal 40. The resulting modulated plane polarized radiation reaches a Brewster plate analyser 74, from which the reflected beam passes through a quarter-wave plate 76 and a narrow-band filter 78 to a further reflector 80 in the form of a gold mirror. The radiation now passes through a laser amplifier 82 to a partially transmitting mirror 84. The reflected light from the mirror 84 is further reflected by a gold mirror 86 through a zinc-selenium lens 88 on to a rotor gravure cylinder 90 carrying the image-receiving surface. The cylinder 90 is mounted on a shaft 92, which is driven in rotation, and the elements 86 and 88 are mounted on a lead screw 94 for slow axial movement, the combination of the rotation of the shaft 92 and the slow axial movement causing the modulated electromagnetic radiation to scan over the image-receiving surface in a series of closely spaced lines.

A feedback detector 96 receives light passing through the partially transmitting mirror 84 and supplies a feedback signal to a circuit 98 in which it is combined with the video signal for application to the amplifier 72. The part of the laser beam which passes through analyser 74 is absorbed by a laser beam "dump" 100.

I claim:

1. An electronic amplifier for driving a load in response to a demand signal, comprising:

a single drive amplifier including means for generating a high frequency carrier and a modulator responsive to the demand signal to modulate the high frequency carrier;

an output means including a plurality of floating output stages connected in series;

and a respective capacitance of very low value for each output stage, each said capacitance being connected to couple the modulated carrier from the single drive amplifier to the respective floating output stage and each output stage having a demodulator for said carrier;

the output means applying the demodulated output signal resulting from the series-connected output stages to the load.

2. An amplifier in accordance with claim 1, in which the said capacitance has a value less than 3 pf.

3. An amplifier in accordance with claim 2, in which the capacitance has a value substantially equal to 1 pf.

4. An amplifier in accordance with claim 1, in which one side of the load is connected to the mid-point of the series of output stages, the output stages on one side of the mid-point being supplied through their capacitances with signals which are in phase opposition with the signals supplied to the output stages on the other side of the mid-point through their capacitances.

5. An amplifier in accordance with claim 1 or 4 comprising a feedback circuit for applying a feedback signal, derived from the said resulting demodulated output signal applied to the load, to the amplifier input.

6. An amplifier in accordance with claim 1 in which the output means comprises a plurality of output stages arranged in a bridge configuration and each receiving the modulated carrier signal through a capacitance of very low value in a phase such that when the demodulated voltage is increasing on one side of the load it is decreasing on the other side.

7. An amplifier in accordance with claim 6, in which differential feedback is taken from both sides of the load to the amplifier input.

8. An amplifier in accordance with claim 6 or 7, comprising, for generating signals in suitable phases for the bridge circuit, a circuit responsive to the demand signal to generate phase-opposed signals on its two output lines, and two carrier-switching circuits to which the phase-opposed signals are respectively applied, the carrier switching circuits respectively providing in response to the phase-opposed signals anti-phase half cycles of amplitude modulated carrier signal, the output of one switching circuit representing a positive error and the output of the other a negative error.

9. An amplifier in accordance with claim 1 comprising between the capacitance and the output means a tuned filter for rejecting any induced signal due to output slewing.

10. An amplifier in accordance with claim 1, in which the output stage comprises a current source in series with a transistor.

11. An amplifier in accordance with claim 1, in which the high frequency is of the order of 20 MHz.

12. An amplifier in accordance with claim 1, in combination with a load in the form of an electro-optic crystal.

13. An amplifier in accordance with claim 11, in which the said transistor is in a grounded-base circuit.

14. Image reproduction apparatus comprising a laser oscillator, a crystal for modulating electromagnetic radiation derived from the laser oscillator, an electronic amplifier having the crystal connected as its load and responsive to a demand signal to supply a modulating signal to the crystal, the amplifier comprising:
- a single drive amplifier including means for generating a high frequency carrier and a modulator responsive to the demand signal to modulate the high frequency carrier;
- an output means including a plurality of floating output stages connected in series;
- and a respective capacitance of very low value for each output stage, each said capacitance being connected to couple the modulated carrier from the single drive amplifier to the respective floating output stages and each output stage having a demodulator for said carrier;
- the output means applying the demodulated output signal resulting from the series-connected output stages to the load.

* * * * *